United States Patent
Liu

(10) Patent No.: US 10,847,691 B2
(45) Date of Patent: Nov. 24, 2020

(54) LED FLIP CHIP STRUCTURES WITH EXTENDED CONTACT PADS FORMED BY SINTERING SILVER

(71) Applicant: Luminus, Inc., Sunnyvale, CA (US)

(72) Inventor: Saijin Liu, San Jose, CA (US)

(73) Assignee: Luminus, Inc., Sunnyvale, CA (US)

( * ) Notice: Subject to any disclaimer, the term of this patent is extended or adjusted under 35 U.S.C. 154(b) by 0 days.

(21) Appl. No.: 14/567,636

(22) Filed: Dec. 11, 2014

(65) Prior Publication Data
US 2016/0172558 A1    Jun. 16, 2016

(51) Int. Cl.
| | | |
|---|---|---|
| H01L 33/62 | (2010.01) | |
| H01L 33/38 | (2010.01) | |
| H01L 33/50 | (2010.01) | |
| H01L 33/00 | (2010.01) | |
| H01L 33/40 | (2010.01) | |
| H01L 25/075 | (2006.01) | |

(52) U.S. Cl.
CPC .............. *H01L 33/62* (2013.01); *H01L 33/38* (2013.01); *H01L 33/382* (2013.01); *H01L 33/40* (2013.01); *H01L 25/0753* (2013.01); *H01L 33/502* (2013.01); *H01L 2224/16225* (2013.01); *H01L 2924/0002* (2013.01); *H01L 2924/181* (2013.01); *H01L 2933/0016* (2013.01); *H01L 2933/0041* (2013.01); *H01L 2933/0066* (2013.01)

(58) Field of Classification Search
USPC ......................................................... 257/79
See application file for complete search history.

(56) References Cited

U.S. PATENT DOCUMENTS

| | | | |
|---|---|---|---|
| 8,586,480 B1* | 11/2013 | Zommer ................. | H01L 24/03 438/119 |
| 2002/0058151 A1* | 5/2002 | Uchikoba ................ | H03H 3/08 428/621 |
| 2005/0145839 A1* | 7/2005 | Yamamoto ........... | C08G 61/122 257/40 |

(Continued)

OTHER PUBLICATIONS

Sintered-Electrodes, Eeginfo,http://www.eeginfo-europe.com/fileadmin/images/produkte/elektroden/sintered-electrodes.pdf, Feb. 1, 2001.*

*Primary Examiner* — Zandra V Smith
*Assistant Examiner* — Lawrence C Tynes, Jr.
(74) *Attorney, Agent, or Firm* — Wolf, Greenfield & Sacks, P.C.

(57) ABSTRACT

Methods and apparatus are provided to improve the yield rate of LED packaging using LED flip chips. In one novel aspect, extended pads made of sintered silver are disposed on the cathode and the anode of the LED flip chip. The thickness of the extended pad is from about 25 μm to about 200 μm. In another embodiment, the LED flip chip further comprises a phosphor layer such that the LED flip chip emits white light. In another novel aspect, the LED flip chip with extended pads made of sintered silver is produced at the wafer level. The wafer level process involves applying sintering silver pastes to the cathode and the anode of each LED flip chip formed on the wafer and sintering the wafer at a temperature about 180° C. to about 240° C. for about two hours. The wafer is cut to individual LED flip chips with extended sintered silver pads.

8 Claims, 6 Drawing Sheets

(56) References Cited

U.S. PATENT DOCUMENTS

| | | | |
|---|---|---|---|
| 2009/0224232 A1* | 9/2009 | Naito | H01G 9/012 |
| | | | 257/40 |
| 2010/0093131 A1* | 4/2010 | Maeda | B23K 1/0016 |
| | | | 438/107 |
| 2010/0195292 A1* | 8/2010 | Ide | H01L 23/3142 |
| | | | 361/748 |
| 2013/0264592 A1* | 10/2013 | Bergmann | H01L 33/50 |
| | | | 257/88 |
| 2013/0271265 A1* | 10/2013 | Finn | H01Q 1/2225 |
| | | | 340/10.1 |
| 2014/0186979 A1* | 7/2014 | Tu | H01L 33/52 |
| | | | 438/27 |
| 2014/0217436 A1* | 8/2014 | Hussell | H01L 33/62 |
| | | | 257/98 |
| 2015/0348948 A1* | 12/2015 | Andrews | H01L 25/0753 |
| | | | 257/89 |

* cited by examiner

LED FLIP CHIP STRUCTURES WITH EXTENDED CONTACT PADS FORMED BY SINTERING SILVER

TECHNICAL FIELD

The present invention relates generally to light-emitting diodes (LEDs) and, more particularly, to LED flip chip structures with extended contact pads formed by sintering silver.

BACKGROUND INFORMATION

Flip chip light emitting diode ("LED") is widely understood to offer a variety of benefits compared to the traditional wire-bond packaging, including superior thermal and electrical performance, higher output capability, and substrate flexibility.

In the traditional wire bonding packaging LEDs, the interconnection between the die and the carrier is made using wire. The die is attached to the carrier face up. Then a wire is bonded first to the die, then looped and bonded to the carrier. Wires are typically 1-5 mm in length and 15-35 µm in diameter. The traditional wire bonding method limits the package density and efficiency. The wire bonds are also easily disturbed. Flip chip LED technology uses the method of electrically connecting the die to the package carrier without wire bonds. The package carrier then provides the connection from the die to the exterior of the package. In contrast, the interconnection between the die and carrier in flip chip packaging is made through a conductive contact that is placed directly on the die surface. The flip chip is then "flipped over" and placed face down, with the cathode and anode contacts connecting to the carrier directly. The flip chip connection is generally formed using solder. A common choice of solder is Tin, Silver, and Copper alloy, namely SAC (Sn/Ag/Cu) solder. The solder contact die is attached to a substrate by a solder reflow process.

Despite the many advantages LED flip chips offered, the low yield rate for the LED flip chip packaging remains a big obstacle for its wider adoption. The problem occurs when packaging LED flip chips onto the printed circuit board (PCB) solder reflow shorts the cathode and the anode of one or more LED flip chips resulting in the failure of the whole LED package.

Improvements for LED flip chips to overcome the low yield rate for LED chip packaging are desirable.

SUMMARY

Methods and bonding structure are provided to improve the yield rate of LED packaging using LED flip chips. In one novel aspect, extended pads made of sintered silver are disposed on the cathode and the anode of the LED flip chip. In one embodiment, the extended pad has a height/thickness of about 100 µm. In other embodiments, the thickness of the extended pad is from about 25 µm to about 200 µm. In one embodiment, the extend pads cover substantially the entire surfaces of the cathode and the anode of the LED flip chip. In another embodiment, the extend pads cover over half of the entire surfaces of the cathode and the anode of the LED flip chip. In yet another embodiment, the LED flip chip further comprises a phosphor layer such that the LED flip chip emits white light. In one embodiment, the phosphor layer is a phosphor film disposed on the LED flip chip.

In another novel aspect, the LED flip chip with extended pads made of sintered silver is produced at the wafer level. The wafer level process includes forming a plurality of flip chips on a wafer; forming flat cathode and anode contacts for each flip chip on the wafer, wherein each flat cathode and anode contact is about less than 5 µm thick; screen printing sintering silver paste onto each of cathode and anode contacts; and dicing the wafer into individual flip chips, wherein each flip chip has extended cathode and anode contact pads made of sintered silver. In The wafer with sintering silver paste deposited are heated at a temperature of about 200° C. for about two hours. In other embodiments, the sintering temperature is from about 180° C. to about 240° C., depending on, at least in part, the characteristics of the sintering silver paste. In yet another embodiment, a phosphor layer is applied over the LED flip chip such that the LED flip chip emits white light.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

LED flip chips can be packaged closer and can be driven at a higher current density, which is especially advantageous with chip-on-board and other high-power applications.

Compared with conventional LED, the light from the active layer emits through the backside of a transparent sapphire substrate. Therefore, there is no light attenuation caused by the metal electrode, and it can also add a high reflectance contact layer to enhance the light emission efficiency. Moreover, the heat generated in the LED can transmit directly through the interconnecting cathode and anode contacts between the LED chip and the PCB substrate, improving the thermal conduction. However, the low yield rate due to cathode and anode shorting during solder reflow process hinders the wide adoption of LED flip chip packaging.

Figure 1:
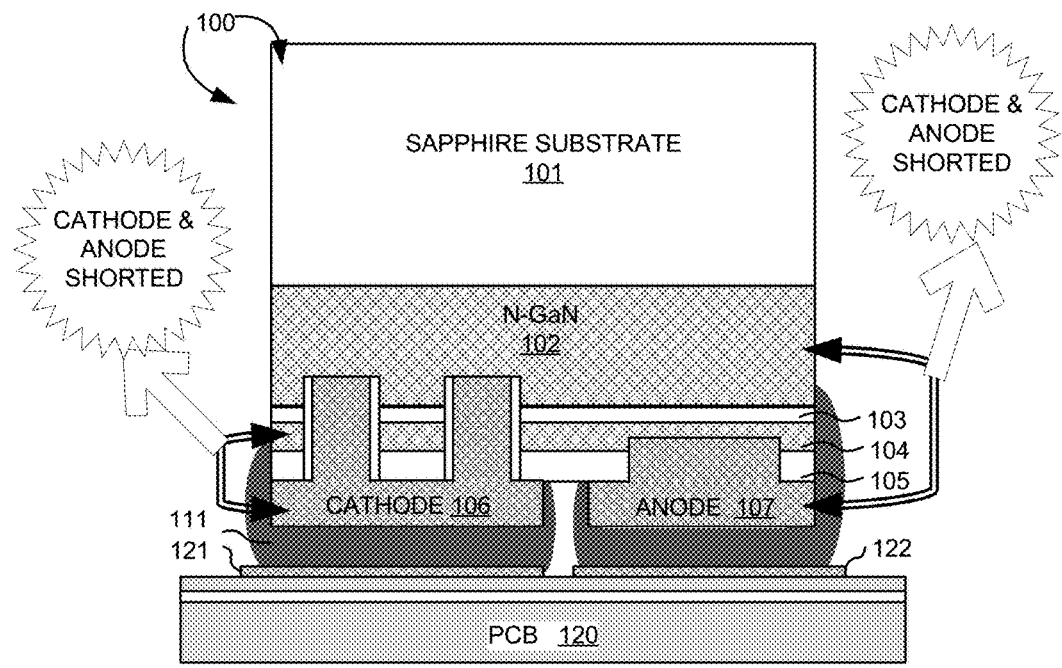
FIG. 1 is a perspective view of an LED flip chip attaching to a PCB board with solder that causes the failure of the package.

FIG. 1 is a perspective view of an LED flip chip 100 attaching to a PCB board 120 with solder 111 that causes the failure of the package typical of that found in the prior art. LED assembly 100 includes a sapphire substrate layer 101, a sapphire substrate layer 101, an N-GaN layer 102, a Multiple Quantum Wall (MQW) layer 103, a P-GaN layer 104, an insulator layer 105, a cathode contact 106 and an anode contact 107. Cathode 106 connects to N-GaN layer 102. Anode 107 connects to the P-GaN layer 104. A PCB N-Metal layer 121 and a PCB P-Metal layer 122 are attached to PCB board 120. Solder 111 bonds LED flip chip 100 onto PCB board 120 through the solder reflow process. Solder 111 bonds cathode 106 to PCB N-metal layer 121 and bonds anode 107 to PCB P-metal layer 122. The solder reflow process bonds LED flip chip 100 to PCB 120. The basic solder reflow process starts with applying a solder paste to the desired pads on PCB, such as PCB N-metal layer 121 and PCB P-metal layer 122. LED flip chip 100 is then placed on solder paste 111, with cathode 106 and anode 107 contacting solder 111. The next step is applying heat to the assembly that cause the solder in the paste to melt (reflow), wet to the PCB and the part termination resulting in the desired solder fillet connection. Ideally, solder 111 occupies only the gap between cathode 106 and PCB N-metal layer 121 and the gap between anode 107 and PCB P-metal layer 122. However, during the solder reflow process, there are chances that excessive solder 111 will overflow and climb along the sidewall of LED flip chip 100. MQW layer 103 is less than one micron thick. P-GaN layer 104 and insulator layer 105 are less than a few micron thick. The overflowed solder may reach the side wall of P-GaN layer 104 and N-GaN layer 102. As shown in FIG. 1, the overflowed solder will connect P-GaN layer 104 and cathode 106, resulting in cathode and anode shorting. The overflowed solder may also connect N-GaN layer 102 and anode 107, resulting in cathode and anode shorting. To overcome that issue, the sidewall of flip chip is usually covered by a thin layer dielectric film, such as SiNx or SiO2. So the solder reflow process does not have a very high rate of such shorting problem. However, the solder paste may damage the dielectric layer and still cause certain rate of shorting. In LED packaging process where multiple or tens or hundreds of LED flip chips are packaged together, one LED flip chip failure results in the whole package fail. Therefore, low individual LED failure may still result in high for the LED flip chip packaging. The resulted low yield rate using LED flip chips is a big obstacle for its wider use.

Figures 2A, 2B:
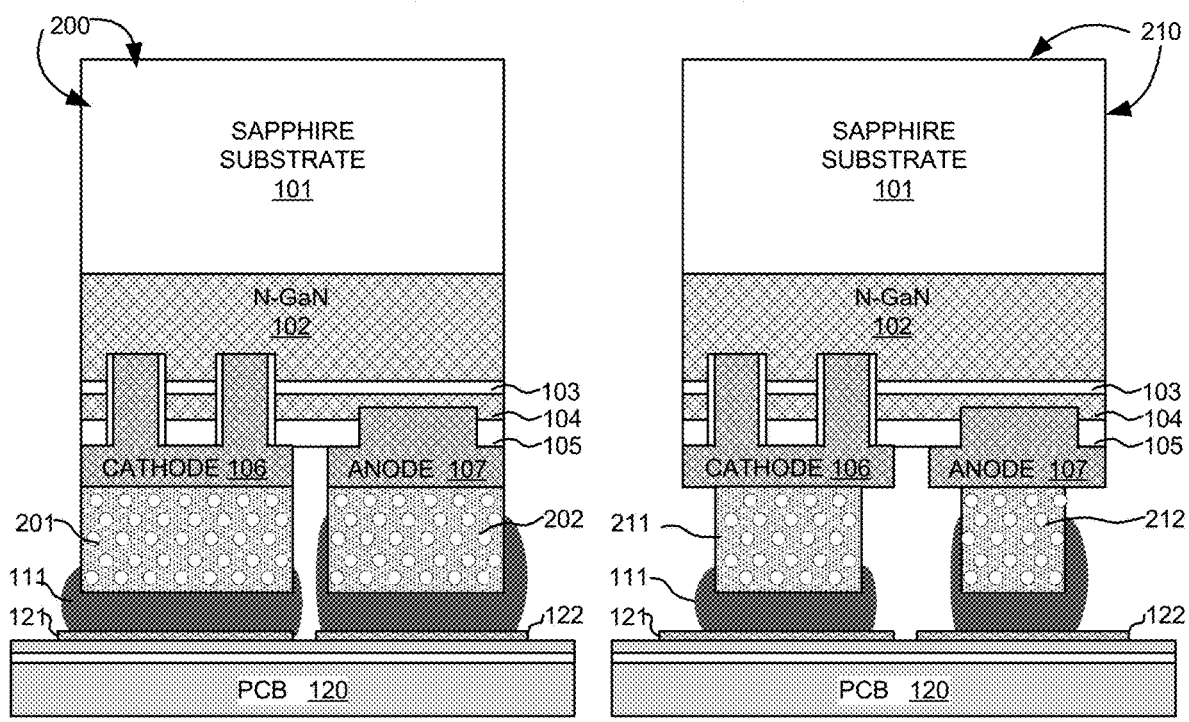
FIG. 2A is a perspective view of an LED flip chip with extended pads of sintered silver in accordance with embodiments of the current invention.
FIG. 2B is a perspective view of an LED flip chip with extended pads of sintered silver that covers a portion of cathode and anode contacts in accordance with embodiments of the current invention.

In one novel aspect of the current invention, an improved LED flip chip is used for LED packaging to avoid the cathode and anode shorting problem. FIG. 2A and FIG. 2B show two embodiments of the improved LED flip chip architecture.

FIG. 2A is a perspective view of an LED flip chip 200 with extended pads of sintered silver in accordance with embodiments of the current invention. LED flip chip 200 has an extended pad 201 extending from cathode 106 and an extended pad 202 extending from anode 107. The extended pads of LED flip chip 200 solve the problem of cathode and anode shorting problem during the solder reflow process. Using the same solder reflow process, even when solder 111 overflows along the sides of LED flip chip 200, solder 111 does not reach P-GaN layer 104 or N-GaN layer 102, instead, it can only overflow to the outer layer of extended pad 201 or extended pad 202. In one embodiment of the current invention, extended sintered silver pad 201 covers the entire surface of cathode 106 and extended silver pad 202 covers the entire surface of anode 107.

Though using extended pads extending from the cathode and the anode of the LED flip chip solves the shorting problem, several important factors have to be addressed to make it a practical solution. First, the extended pads have to possess good thermal conductivity. One of the advantages of LED flip chip technology is that heat generated in the LED can transmit directly through the interconnecting cathode and anode contacts between the LED chip and the PCB substrate, improving the thermal conduction. Therefore, it is important for the extended pads to have high thermal conductivity such that the heat can continue dispensing from the cathode and the anode through the extended pads. High thermal conductivity materials must be used for the extended pad.

Second, the extended pad must be of relatively low cost. It is conceivable that the thicker the extended pad layer, the higher yield rate it can achieve. However, materials that have good thermal and electrical conductivities can be prohibited high making the solution unviable. If the material is of a high cost, only a thin extended pad may be used, which may still cause a certain percentage of failure rate.

In one novel aspect of the current invention, sintered silver is used for the extended pad, meeting both of the above requirements. Sintered silver is a solid state silver formed through sintering the sinter silver paste. In general, sinter silver paste is micro-silver particles, with size smaller than 10 μm mixed with organic solvents to avoid agglomeration. One example of sintering silver paste that may be used for the present invention is Namics UNIMEC XH9890-7A. Sinter silver has special characteristics of having a low sintering temperature (below 300° C.) and a high subsequent reflow temperature (above 930° C.). Upon being heated to around 180° C. to about 240° C., the sintered organic solvents in sinter silver paste are burnt out and the paste agglomerates to become solid silver. Once the solid sintered silver is formed, the melting point of the sintered silver is above 930° C., making it a good material for the regular soldering process. Sintered silver is of relative low cost, making it a viable material to be used for the extended pads. Further, sintered silver has high thermal and electrical conductivity. Furthermore, the sintered silver, through the sintering process, are porous materials resulting in lower stress, which provides good resistance to thermal expansion mismatch problem.

The low cost of sintered silver makes it economically viable to make the expanded pads thick enough to avoid the shorting problem during the solder reflow process. The thickness of the extended pad can be from about 25 μm to about 200 μm, preferably from about 50 μm to about 100 μm. In one embodiment, the sintered silver extended pad is about 100 μm thick. The characteristics of the sintered silver give the LED flip chip good thermal conductivity even with the relatively thick extended pad. The low cost of the sintered silver and simple sintering process at low temperature of below 300° C. makes it economically possible for mass production.

FIG. 2B is a perspective view of an LED flip chip 210 with extended pads of sintered silver that covers a portion of cathode and anode contacts in accordance with embodiments of the current invention. In embodiments of the current invention, the sintered silver pads do not cover the entire surface of the cathode and anode contacts. LED flip chip 210 has an extended pad 211 extending from cathode 106 and an extended pad 212 extending from anode 107. Extended pad 211 covers a portion of cathode 106. In one embodiment, extended pad 211 covers substantially entire surface of cathode 106, such as from about 80% to about 100%. In another embodiment, extended pad 211 covers about 50% to about 80% of the surface of cathode 106. Similarly, extended pad 212 covers a portion of cathode 107. In one embodiment, extended pad 212 covers substantially entire surface of anode 107, such as from about 80% to about 100%. In another embodiment, extended pad 212 covers about 50% to about 80% of the surface of anode 107. By reducing overall size of the extended pads, the cost of LED flip chip 210 can be further reduced. The good thermal conductivity of the sintered silver enables the overall good heat dispensing even with smaller contact area for the heat transfer from cathode 106 and anode 107. The balance of cost reduction and good thermal conductivity is considered, either using experimental data or product data sheet, to reach a design criteria. It is understood that sintered silver extended pad 211 and sintered silver extended pad 212 can be of different size and/or different percentage contact area of cathode 106 and anode 107, respectively. Further, sintered silver extended pads 211 and 212 can be of different shapes. In one embodiment, the extended pads can be of generally cubic shape. In other embodiments, the extended can be of rectangular block shape, cylinder shape, trapezoid shape, or a cone shape with sharp/pointy endings. It is understood that different sintered silver extended pad 211 and sintered silver extended pad 212 can be of different shapes.

Figure 3:
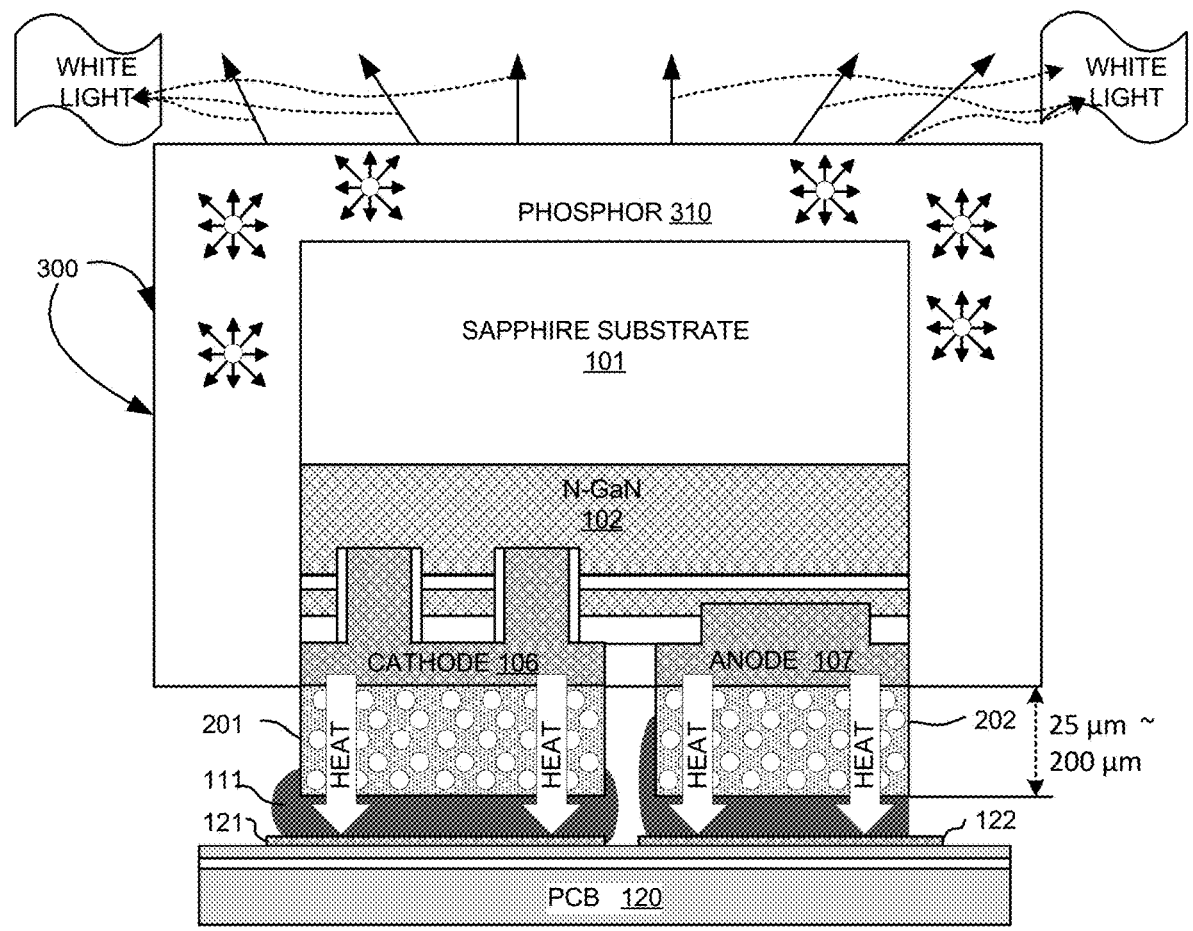
FIG. 3 is a perspective view of an LED flip chip 300 with a phosphor film layer 310 in accordance with embodiments of the current invention.

FIG. 3 is a perspective view of an LED flip chip 300 with a phosphor film layer 310 in accordance with embodiments of the current invention. In one embodiment, phosphor layer 301 is phosphor film adhering to the outer surfaces of the LED flip chip. Phosphor layer 301 produces white light in a single LED by combining a short wavelength LED such as blue or UV, and a yellow phosphor coating. Applying phosphor layer 301 enables LED flip chip 300 generates white light without requiring addition phosphor layers for LED packaging.

In one embodiment of the current invention, phosphor layer 301 is applied to the LED flip chip by spray coating. Spray coating involves spraying phosphor on the surface of the LED flip chip. The thin phosphor layer is formulated on the LED flip chip following the spray coating process. In another embodiment of the current invention, phosphor layer 301 is applied to the LED flip chip by film laminating. The film laminating process applies phosphor sheets over the LED flip chip and adheres the phosphor sheet through laminating process. The phosphor sheets adhere to the LED flip chip after the film laminating process. Other methods, such as the molding process, can also be used to apply phosphor layer to the LED flip chip to produce a final product of the LED flip chip emitting white light with extended sintered silver pads.

Disposing sintered silver over cathode and anode contacts of the LED flip chip solves the shorting problem during LED flip chip packaging and increases the yield rate of product. The low cost, high electrical and thermal conducting sintered silver pads prevent solder paste from climbing onto the LED flip chip sidewall and thereby prevent the solder paste from shorting the cathode and the anode of the LED flip chip. Different processes can apply to dispose the extended sintered silver pads onto an LED flip chip. In one embodiment, the extended sintered silver pads are disposed onto the off the shelf individual LED flip chip. In another embodiment, the extended sintered silver pads are applied at the wafer level.

Figure 4:
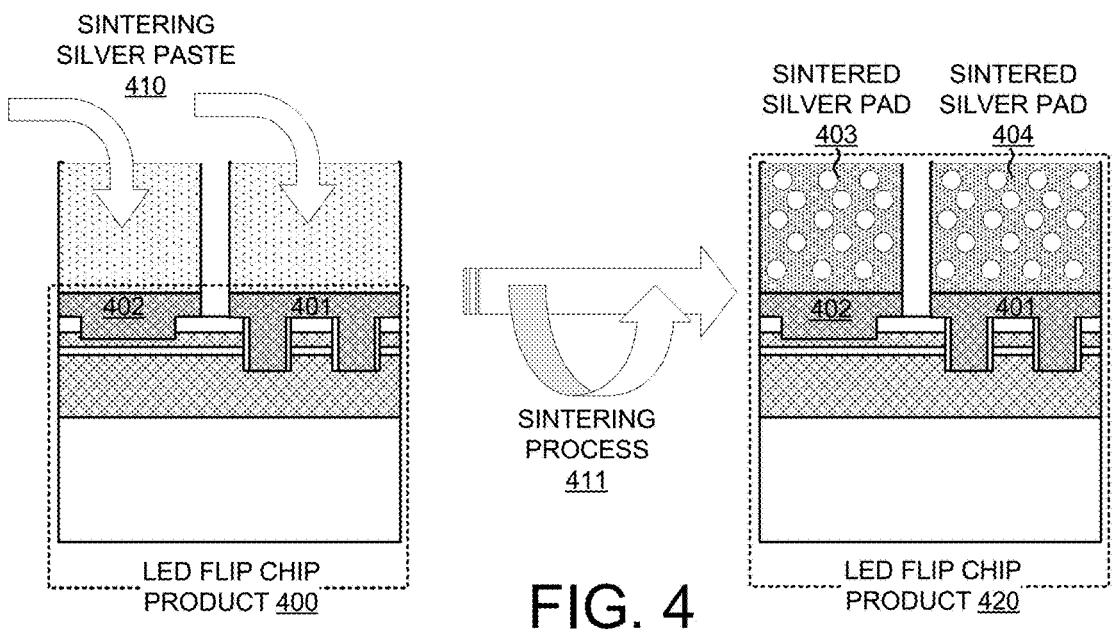
FIG. 4 shows an exemplary process to dispose sintered silver pads onto an LED flip chip product in accordance with the current invention.

FIG. 4 shows an exemplary process to dispose sintered silver pads onto an LED flip chip product 400 in accordance with the current invention. LED flip chip product 400 has a cathode 401 and an anode 402. In order to dispose extended sintered silver pads on the top surfaces of cathode 401 and anode 402, pin transfer or dispensing process is used to first apply sintering silver paste 410 on cathode 401 and anode 402. Using the pin transfer process method, sintering silver paste 410 is transferred by means of one or more dedicated pins. The dedicated pins dips sintering silver paste 410 onto cathode 401 and anode 402. One example of the dispensing process is to dispose the sintering silver paste using a dispensing machine, such as a Palomar Ultra-Versatile 3800 Die Bonder. In particular, the dot dispensing method can be used to apply sintering silver paste to the cathode and anode contact. In another embodiment, dispensing process can be used to transfer sintering silver paste 410 onto cathode 401 and anode 402. In another embodiment, more than one LED flip chips are placed on tape. The pin transfer process or the dispensing process transfers sintering silver paste to the top surface of the cathode and the top surface of the anode for each LED flip chip.

Once sintering silver paste 410 is transferred to the cathode and the anode of each of the one or more LED flip chips, a sintering process 411 is followed. Sintering process 411 involves placing the one or more LED flip chips with sintering silver 410 deposited into an oven at a sintering temperature for a sintering period. In one embodiment, the sintering temperature is from about 180° C. to about 240° C. Different temperature setting is at least in part determined by the sintering silver paste. Different sintering silver paste may have different optimized sintering temperature and temperature ramping profile. In another embodiment, the sintering time is about two hours. The sintering time is at least in part determined by the sintering silver paste.

Upon completing sintering process 411, a LED flip chip 420 is formed with a sintered silver pad 403 disposed over anode 402 and a sintered silver pad 404 disposed over cathode 403. In one embodiment, sintered silver pads 403 and 404 have a thickness of about 25 µm to about 200 µm, preferably from about 50 µm to about 100 µm. In another embodiment, the sintered silver extended pad is about 100 µm thick. In one embodiment, a phosphor process is followed by sintering process 411 The phosphor process adheres phosphor films to LED flip chip 420 such that LED flip chip 420 emits white light.

In one novel aspect, the extended sintered silver pad can be applied on wafer level by screen printing and then sintering. Making the extended pad at wafer level make it possible for mass production of the enhanced LED flip chip.

Figure 5:
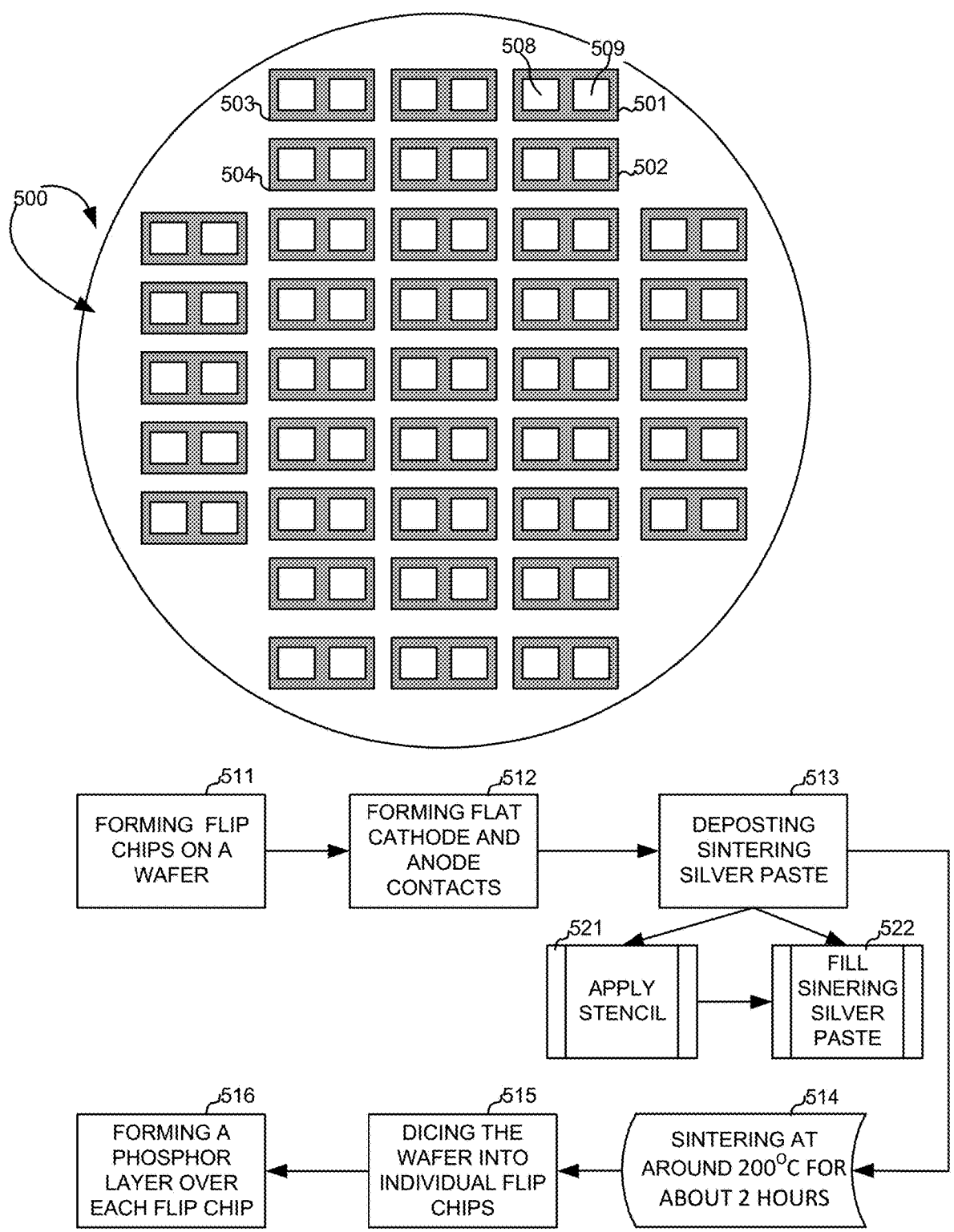
FIG. 5 shows an exemplary diagram of the wafer level process including an exemplary flow chart in accordance with embodiments of the current invention.

FIG. 5 shows an exemplary diagram of the wafer level process including an exemplary flow chart in accordance with embodiments of the current invention. Multiple LED flip chips are formed on a wafer 500. An LED flip chip 501 is formed with a cathode contact 508 and an anode contact 509. Similarly an LED flip chip 502, 503 and 504 are formed on wafer 500, each with a cathode contact and an anode contact. In one example, wafer 500 may have about one thousand LED flip chips. The number of LED flip chips formed on one wafer can go up to six thousand or to ten thousand. The size of the LED flip chips can vary as well. It is understood that different wafer size and LED flip chip size can all apply to the current method.

In one novel aspect, LED flip chips with extended sintered silver pads can be produced at the wafer level. An exemplary flow chart of the process is shown in FIG. 5. At step 511, a number of LED flip chips are formed on a wafer. At step 512, these LED flip chips each form a cathode contact and an anode contact. At step 513, sintering silver paste is deposited to each of the cathode and anode contact. In one embodiment, the depositing process is a stencil process involves two steps. At step 521, a stencil is applied to the wafer. The stencil is cut such that the sintering silver paste is applied to each of the cathode contacts and the anode contact on the wafer. Once the stencil is placed on the wafer, at step 522, sintering silver paste is filled to wafer. Other processes can be used to deposit the sintering silver paste to the cathode and anode. These processes include but not limited to screen printing process, dispensing process and pin transfer process. Upon completion of the screen printing process 513, the wafer is put in the oven at a sintering temperature for a sintering period. In one embodiment, the sintering temperature is about 200° C. and the sintering time is about two hours. In other embodiments, the sintering temperature can be from about 180° C. to about 240° C. The sintering temperature and sintering time are determined based on factors such as the make of the sintering silver paste. Once the sintering silver paste is sintered, solid sintered silver pad are formed for each LED flip chip on the wafer. Step 515 dices the wafer into individual flip chips. In one embodiment of the current invention, a phosphor process step is followed. At step 515, phosphor layers are applied to each LED flip chips such that the LED flip chips with the extended sintered silver pads emits white light.

Figure 6:
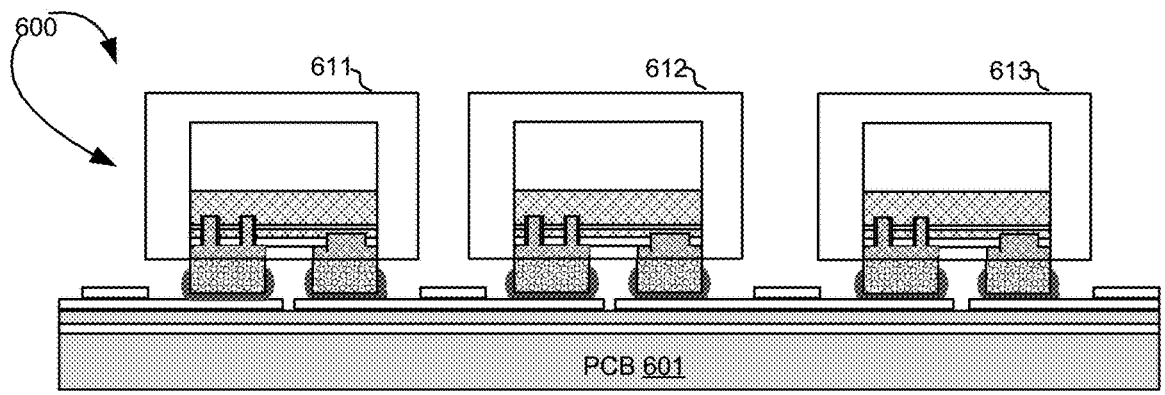
FIG. 6 shows an exemplary LED packaging of LED flip chips with extended sintered silver pads on PCB board bonded with solder paste in accordance with embodiments of the current invention.
Figure 7:
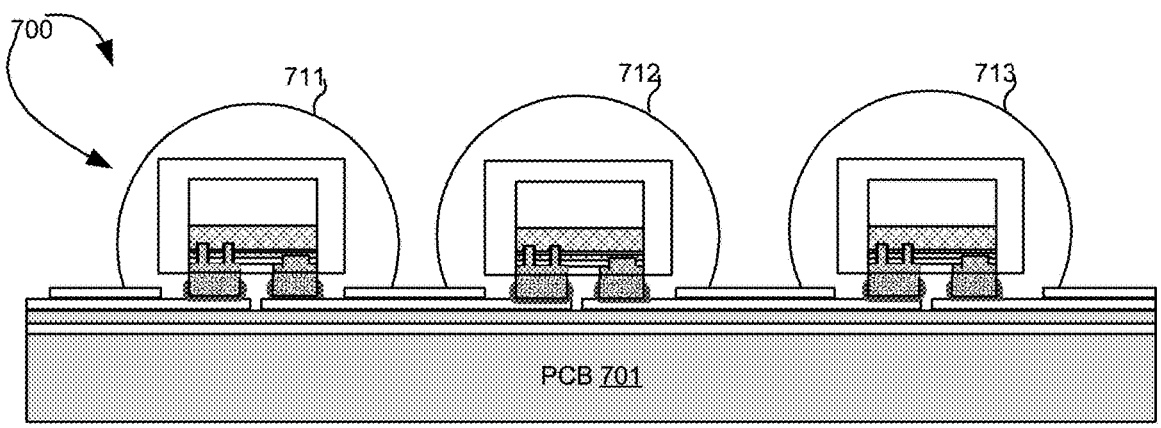
FIG. 7 shows an exemplary LED packaging of LED flip chips on PCB board bonded with solder paste, where the LED flip chips have extended sintered silver pads with added silicone dome in accordance with embodiments of the current invention.
Figure 8:
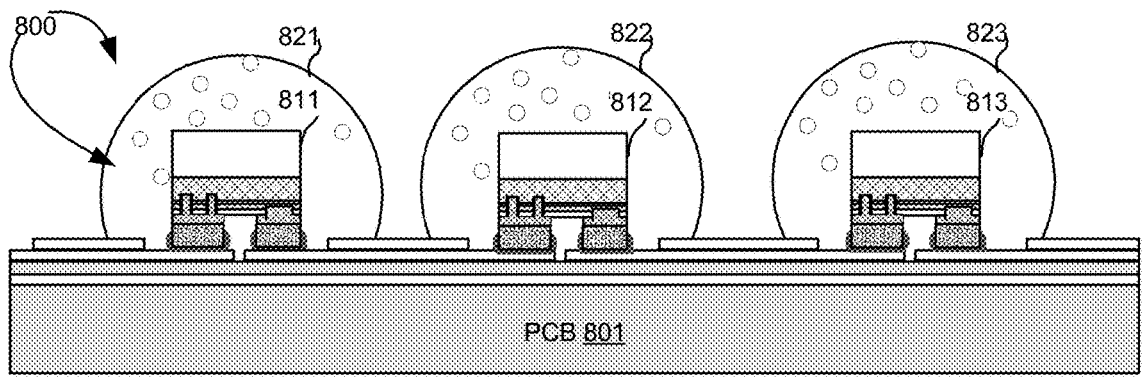
FIG. 8 shows an exemplary LED packaging of LED flip chips on PCB board bonded with solder paste, where the LED flip chips are coupled with remote phosphors.

The extended sintered silver pads prevent the solder paste from climbing onto flip chip sidewalls by absorbing excessive solder paste and increasing the height or distance. Using LED flip chips with the extended sintered silver pads increases LED packaging yield rate because it avoids the shorting problem during the solder reflow process. FIG. 6 to FIG. 8 show exemplary LED packaging using LED flip chips with the extended sintered silver pads.

FIG. 6 shows an exemplary LED packaging 600 of LED flip chips with extended sintered silver pads on PCB board bonded with solder paste in accordance with embodiments of the current invention. LED packaging 600 has multiple LED flip chips bonded with solder paste, such as SAC, on a PCB board 601. PCB board 601 can be circular, linear, or panel shaped. In one embodiment, LED flip chips with extended sintered silver pads with phosphor films are used for LED packaging 600. Exemplary LED flip chips 611, 612 and 613 are shown, each with extended sintered silver pads and phosphor films. Since LED flip chips 611, 612 and 613 are made with phosphor films, they directly emit white light. LED packaging 600 is built by simply solder pasting LED flip chips, such as 611, 612 and 613, on PCB board 601. Due to the extended sintered silver pads for each LED flip chip, the solder pasted LED flip chips avoid the shorting problems occurred to LED flip chips without the extended pads. The yield rate for LED packaging 600 may be increased by employing the subject invention.

FIG. 7 shows an exemplary LED packaging 700 of LED flip chips on PCB board bonded with solder paste, where the LED flip chips have extended sintered silver pads with added silicone dome in accordance with embodiments of the current invention. LED packaging 700 has multiple LED flip chips bonded with solder paste, such as SAC, on a PCB board 701. PCB board 701 can be circular, linear, or panel shaped. Similar to LED packaging 600, LED flip chips for LED packaging 700 with extended sintered silver pads with phosphor films are used for LED packaging 700. Exemplary LED flip chips 711, 712 and 713 are shown, each with extended sintered silver pads and phosphor films. Different from LED packaging 600, LED flip chips for LED packaging 700 have silicone dome to improve efficiency. The silicone dome can be formed by dispensing process. LED packaging 700 is built by simply solder pasting LED flip chips, such as 711, 712 and 713, on PCB board 701. Due to the extended sintered silver pads for each LED flip chip, the solder pasted LED flip chips avoid the shorting problems occurred to LED flip chips without the extended pads. The yield rate for LED packaging 700 is increased.

FIG. 8 shows an exemplary LED packaging 800 of LED flip chips on PCB board bonded with solder paste, where the LED flip chips are coupled with remote phosphors. LED packaging 800 has multiple LED flip chips bonded with solder paste, such as SAC, on a PCB board 801. PCB board 801 can be circular, linear, or panel shaped. In one embodiment, LED flip chips with extended sintered silver pads without phosphor films are used for LED packaging 800. Exemplary LED flip chips 811, 812 and 813 are shown, each with extended sintered silver pads. Since LED flip chips 811, 812 and 813 are made without phosphor films, remote phosphors 821, 822 and 823 are coupled to each of the LED flip chips 811, 812 and 813, respectively. LED packaging 800 is built by simply solder pasting LED flip chips, such as 811, 812 and 813, on PCB board 601. Due to the extended sintered silver pads for each LED flip chip, the solder pasted LED flip chips avoid the shorting problems occurred to LED flip chips without the extended pads. The yield rate for LED packaging 800 is increased.

Figure 9:
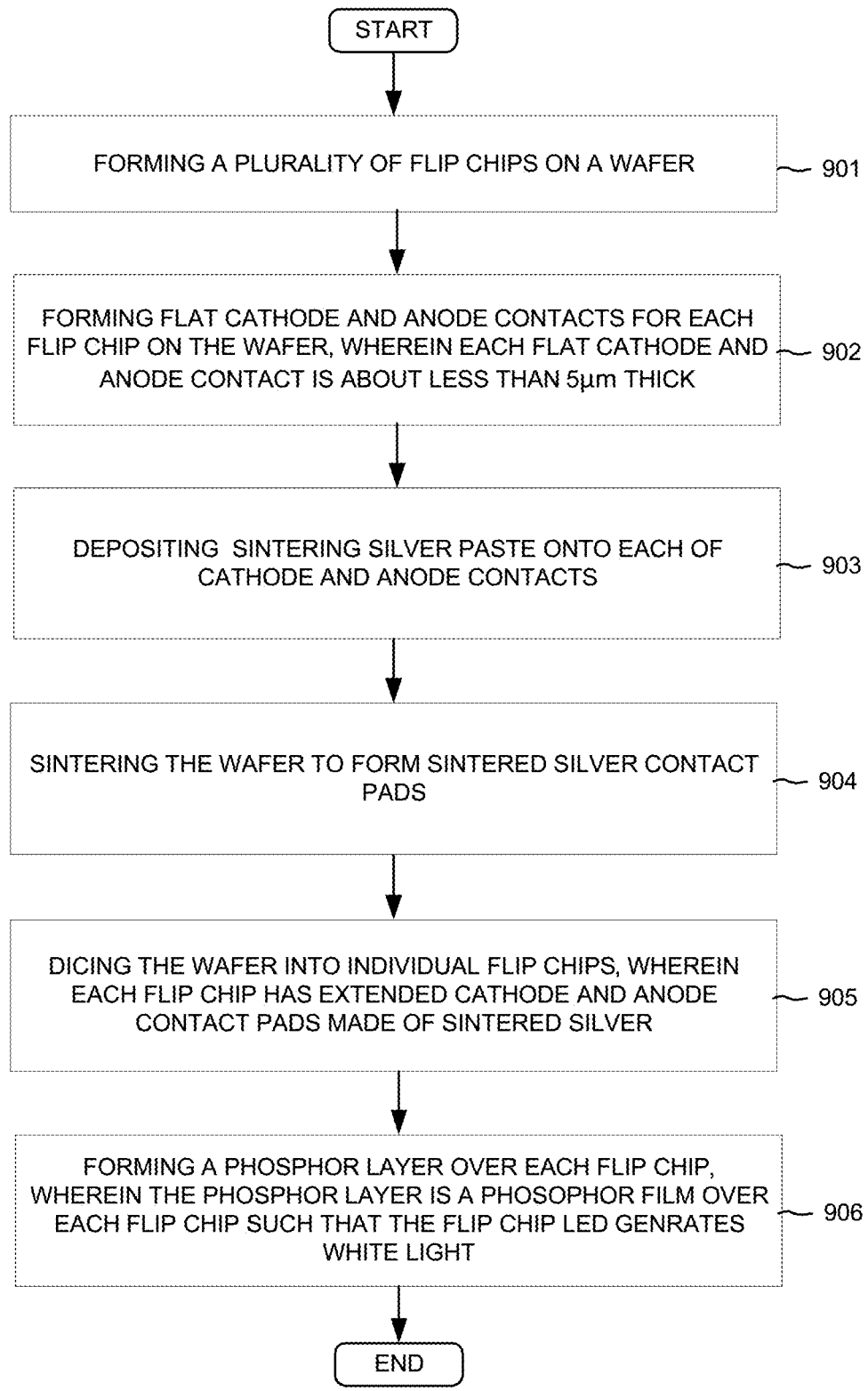
FIG. 9 shows an exemplary flow chart of making LED flip chip with extended sintered silver pads at the wafer level in accordance with embodiments of the current invention.

FIG. 9 shows an exemplary flow chart of making LED flip chip with extended sintered silver pads at the wafer level in accordance with embodiments of the current invention. Step 901 forms a plurality of flip chips on a wafer. Step 902 forms flat cathode and anode contacts for each flip chip on the wafer, wherein each flat cathode and anode contact is about less than 5 μm thick. Step 903 deposits sintering silver paste onto each of cathode and anode contacts. Step 904 sinters the wafer to form sintered silver contact pads. Step 905 dices the wafer into individual flip chips, wherein each flip chip has extended cathode and anode contact pads made of sintered silver. Step 906 forms a phosphor layer over each flip chip, wherein the phosphor layer is a phosophor film over each flip chip such that the flip chip LED generates white light.

Figure 10:
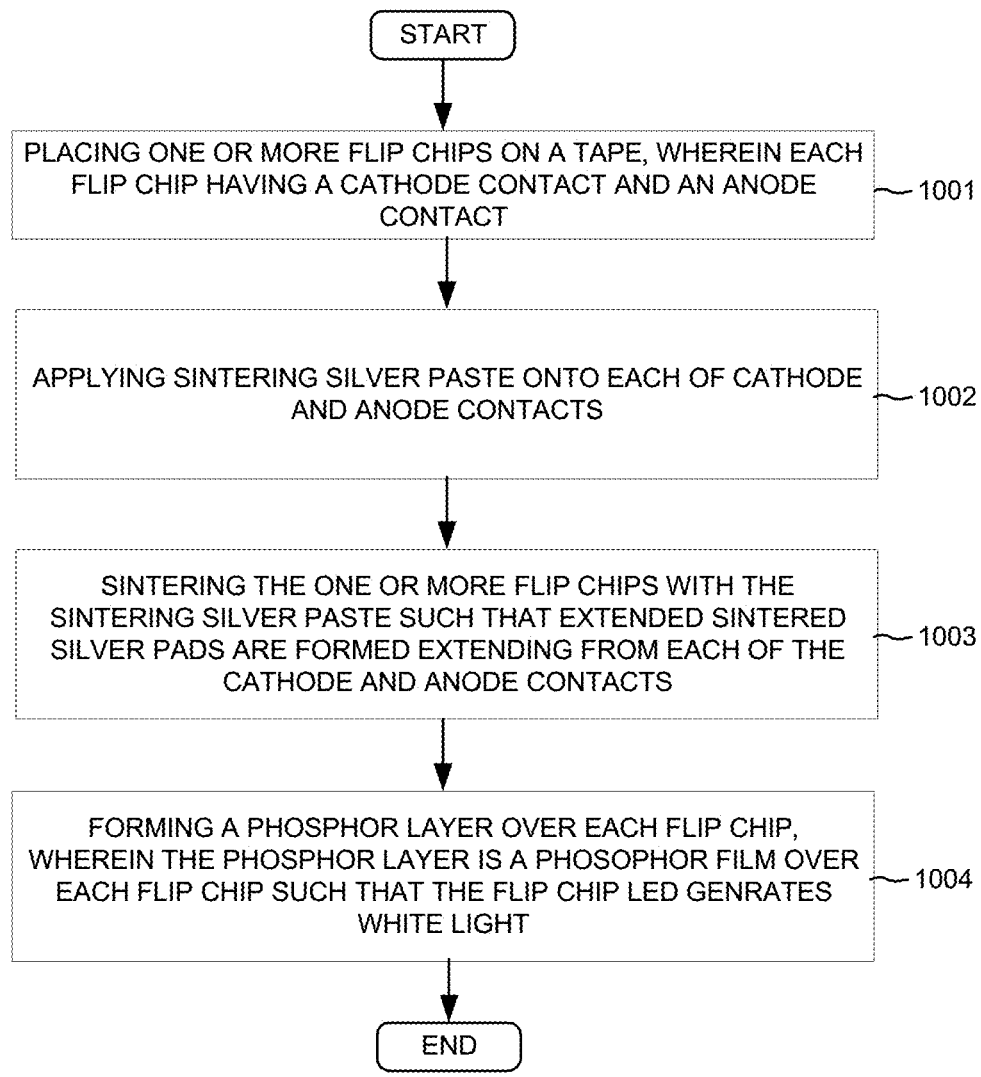
FIG. 10 shows an exemplary flow chart of disposing extended sintered silver pads onto LED flip chips in accordance with embodiments of the current invention.

FIG. 10 shows an exemplary flow chart of disposing extended sintered silver pads onto LED flip chips in accordance with embodiments of the current invention. Step 1001 places one or more flip chips on tape, wherein each flip chip having a cathode contact and an anode contact. Step 1002 applies sintering silver paste onto each of cathode and anode contacts. Step 1003 sinters the one or more flip chips with the sintering silver paste such that extended sintered silver pads are formed extending from each of the cathode and anode contacts. Step 1004 forms a phosphor layer over each flip chip, wherein the phosphor layer is a phosphor film over each flip chip such that the flip chip LED generates white light.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An apparatus, comprising:
   a light emitting device (LED) flip chip having a cathode contact with a first surface and an anode contact with a second surface;
   a first extended pad disposed over the entire first surface of the cathode contact and lateral side surfaces of the first extended pad are co-planar with lateral side surfaces of the cathode contact, wherein the first extended pad comprises sintered silver;
   a second extended pad disposed over the entire second surface of the anode contact and lateral side surfaces of the second extended pad are co-planar with lateral side surfaces of the anode contact, wherein the second extended pad comprises sintered silver; and
   a PCB substrate connected to the first extended pad and the second extended pad via metal regions.

2. The apparatus of claim 1, wherein the first and the second extended pad is about 25 µm to 200 µm in thickness.

3. The apparatus of claim 1, wherein the first and the second extended pad is about 50 µm to 100 µm in thickness.

4. The apparatus of claim 1, wherein the first and the second extended pads have porous structures formed during a sintering process.

5. The apparatus of claim 1, wherein the first and the second extended pad is applied on wafer level by sintering silver using screen printing.

6. The apparatus of claim 1, further comprising a phosphor layer over the flip chip, wherein the phosphor layer is a phosphor film over the LED flip chip such that the LED flip chip generates white light.

7. The apparatus of claim 6, wherein phosphor layer is applied by spray coating.

8. The apparatus of claim 6, wherein phosphor layer is applied by film laminating.

* * * * *